(12) United States Patent
Lundgren et al.

(10) Patent No.: US 12,396,123 B2
(45) Date of Patent: Aug. 19, 2025

(54) SYSTEMS AND METHODS FOR ENVIRONMENTAL CONTROL OF AN ENCLOSURE

(71) Applicant: Vertiv Corporation, Columbus, OH (US)

(72) Inventors: Anders Lundgren, Enebyberg (SE); Hans Thorslund, Tyresö (SE)

(73) Assignee: Vertiv Corporation, Westerville, OH (US)

( * ) Notice: Subject to any disclaimer, the term of this patent is extended or adjusted under 35 U.S.C. 154(b) by 400 days.

(21) Appl. No.: 17/945,208

(22) Filed: Sep. 15, 2022

(65) Prior Publication Data

US 2023/0085349 A1    Mar. 16, 2023

Related U.S. Application Data

(60) Provisional application No. 63/244,921, filed on Sep. 16, 2021.

(51) Int. Cl.
*H05K 7/20* (2006.01)

(52) U.S. Cl.
CPC ..... *H05K 7/20136* (2013.01); *H05K 7/20145* (2013.01); *H05K 7/20172* (2013.01); *H05K 7/20209* (2013.01)

(58) Field of Classification Search
CPC .......... H05K 7/20136; H05K 7/20145; H05K 7/20172; H05K 7/20209
See application file for complete search history.

(56) References Cited

U.S. PATENT DOCUMENTS

| | | | | |
|---|---|---|---|---|
| 7,443,674 B1* | 10/2008 | Hanlon | ............. | H05K 7/20736 361/695 |
| 2009/0046255 A1* | 2/2009 | Kato | ..................... | G03B 21/16 353/57 |
| 2012/0140402 A1* | 6/2012 | Mizumura | ......... | H05K 7/20836 361/679.33 |

(Continued)

FOREIGN PATENT DOCUMENTS

| KR | 101865002 | 6/2018 |
|---|---|---|
| KR | 1020180126823 | 11/2018 |

OTHER PUBLICATIONS

International Search Report for International Application No. PCT/US2022/043584 dated Jan. 4, 2023.

*Primary Examiner* — Gary Collins
(74) *Attorney, Agent, or Firm* — Suiter Swantz IP

(57) ABSTRACT

In some embodiments, apparatuses and methods are provided herein useful for environmental control inside an enclosure including an enclosure, an exhaust fan located in proximity to an outlet of the enclosure, a temperature sensor located proximate the exhaust fan and configured to provide exhaust air temperature data, a first sensor located proximate a supply intake of one of one or more electronic equipment and configured to provide sensor data associated with air that is supplied to the one of the one or more electronic equipment, a fan control unit (FCU), and a power control unit (PCU). The FCU is configured to adjust fan speed of the exhaust fan. The PCU is configured to receive the sensor data from the first sensor; receive the exhaust air temperature data; and provide the fan speed control data to the FCU based on the sensor data and the exhaust air temperature data.

18 Claims, 11 Drawing Sheets

(56) References Cited

U.S. PATENT DOCUMENTS

| | | |
|---|---|---|
| 2013/0233532 A1 | 9/2013 | Imwalle |
| 2015/0378404 A1 | 12/2015 | Ogawa |
| 2018/0107180 A1 | 4/2018 | Slessman |
| 2021/0278884 A1* | 9/2021 | Miyamoto ................ G06F 1/20 |

* cited by examiner

SYSTEMS AND METHODS FOR ENVIRONMENTAL CONTROL OF AN ENCLOSURE

CROSS REFERENCE TO RELATED APPLICATION

The present application claims priority from U.S. provisional application Ser. No. 63/244,921, filed Sep. 16, 2021, the disclosure of which is hereby incorporated by reference in its entirety into the present disclosure.

TECHNICAL FIELD

This invention relates generally to controlling the environment inside an equipment enclosure.

BACKGROUND

Generally, in a typical equipment enclosure, the exhaust fan starts based on an exhaust temperature. Thus, there is not a good control of the supply air temperature to equipment, the relative humidity of the supply air to equipment, and the equipment's indoor environment. An insufficiently controlled equipment's indoor environment increases the risk of corrosion on the equipment that can lead to an equipment failure and unnecessary maintenance costs.

BRIEF DESCRIPTION OF THE DRAWINGS

Disclosed herein are embodiments of systems, apparatuses and methods pertaining to controlling the environmental condition inside an equipment enclosure. This description includes drawings, wherein.

Figure 1:
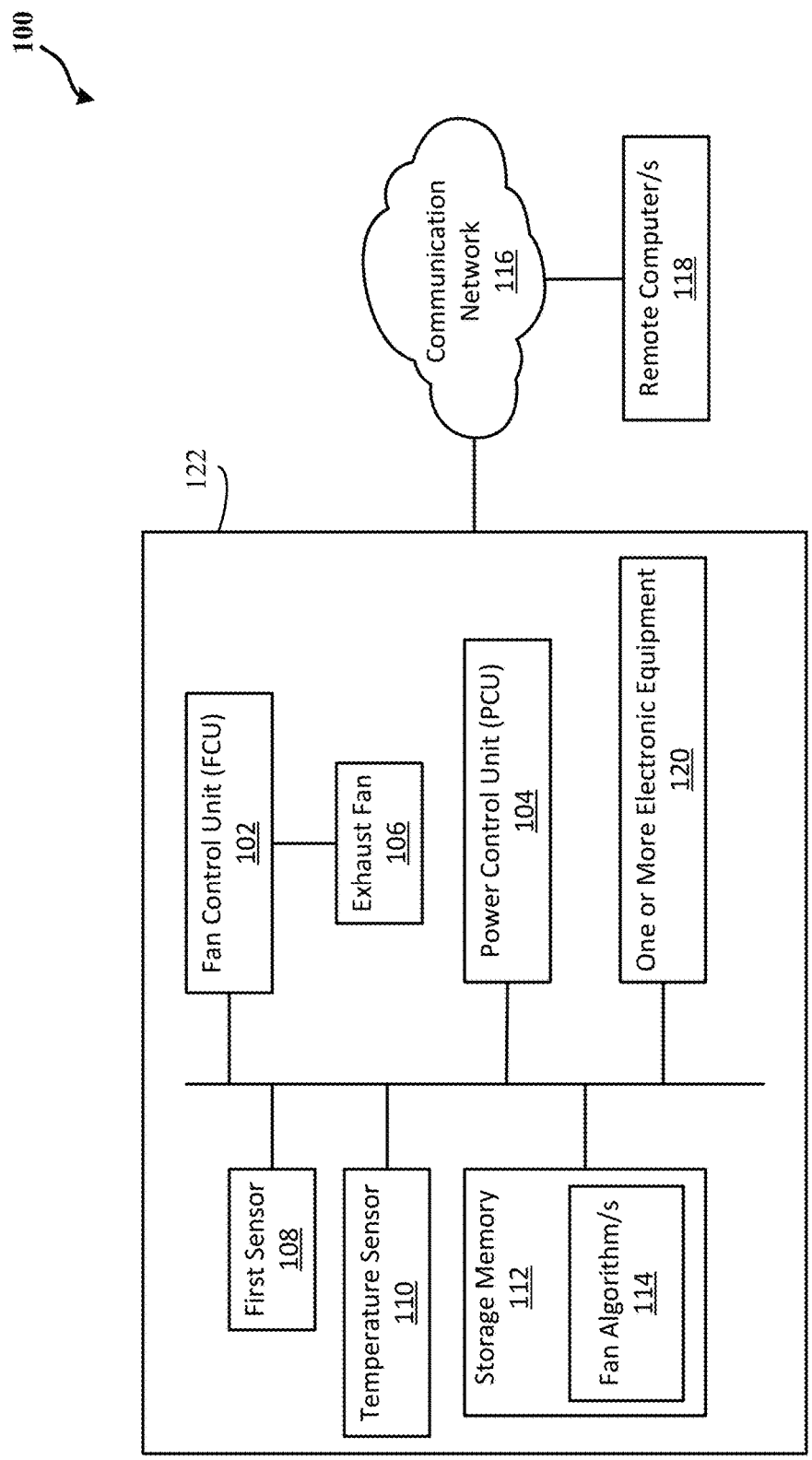
FIG. 1 is a simplified block diagram of an exemplary system for environmental control inside an enclosure in accordance with some embodiments.

Elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention. Certain actions and/or steps may be described or depicted in a particular order of occurrence while those skilled in the art will understand that such specificity with respect to sequence is not actually required. The terms and expressions used herein have the ordinary technical meaning as is accorded to such terms and expressions by persons skilled in the technical field as set forth above except where different specific meanings have otherwise been set forth herein.

DETAILED DESCRIPTION

Aspects and advantages of the present disclosure will be set forth in part in the following description, or may be obvious from the description, or may be learned through practice of the present disclosure. For example, the present disclosure improves on the conventional way of controlling an environmental condition inside an enclosure based, at least in part, on the determination of the speed of the exhaust fan on the sensor data associated with inlet air prior to or as the inlet air enters and/or goes through an equipment housed inside the enclosure; thereby securing and/or regulating optimal temperature of the equipment housed inside the enclosure and not overriding the operating temperature condition of the exhaust fan(s) of the enclosure. In lieu of the foregoing or in combination therewith, the present disclosure improves on the conventional way of controlling an environmental condition inside the enclosure by defining the start temperature and/or relative humidity of the equipment in combination with the outside relative humidity and not overriding an operating temperature condition of the exhaust fan(s) of the enclosure. In lieu of the foregoing or in combination therewith, the present disclosure improves on the conventional way of controlling an environmental condition inside the enclosure by securing and/or regulating an indoor environment inside the enclosure in combination with defining the outdoor environment in accordance with an industry standard. In lieu of the foregoing or in combination therewith, the present disclosure improves on the conventional way of controlling an environmental condition inside the enclosure by securing and/or regulating the relative humidity and/or the temperature environment inside the enclosure without defining the environment outside the enclosure. As such, the present disclosure provides one or more solutions to sufficiently control the equipment's indoor environment that reduces and/or mitigates the risk for corrosion of the equipment and/or the electrical components housed inside the enclosure that are used to enable the operation of the equipment.

Generally speaking, pursuant to various embodiments, systems, apparatuses and methods are provided herein useful for controlling an environmental condition inside an enclosure. In some embodiments, a system for environmental control inside an equipment enclosure includes an enclosure housing one or more electronic equipment. The enclosure may include an inlet and an outlet. The system includes an exhaust fan located in proximity to the outlet or within the enclosure that creates an airflow out of the enclosure through the outlet. The system includes a temperature sensor located proximate the exhaust fan that provides exhaust air temperature data. The system includes a first sensor located proximate a supply intake of one of the one or more electronic equipment that provides sensor data associated with air that enters the one of the one or more electronic equipment. The system may include a fan control unit (FCU) coupled to the exhaust fan. The FCU may adjust fan speed of the exhaust fan based on fan speed control data. In some embodiments, the system may include a power control unit (PCU) coupled to the FCU, the temperature sensor, and/or the first sensor. The PCU may receive the sensor data from the first sensor, receive the exhaust air temperature data from the temperature sensor, and provide the fan speed curve data to the FCU. Based on the sensor data and the exhaust air temperature data, the FCU may control the speed of the fan to maintain one or more environmental parameters of the enclosure.

In some embodiments, a method for environmental control inside an equipment enclosure includes receiving, at a power control unit (PCU), sensor data associated with air that enters an enclosure from a first sensor located proximate a supply intake of an equipment of the enclosure. The method may include receiving, at the PCU, exhaust air temperature data from a temperature sensor located proximate an exhaust fan configured to create an airflow out of the enclosure via an outlet of the enclosure. The method may include providing, by the PCU, fan speed control data to a fan control unit (FCU) based on the sensor data and the exhaust air temperature data to maintain one or more environmental parameters of the enclosure. The method may include adjusting, by the FCU, fan speed of the exhaust fan based on the fan speed control data.

Figure 2:
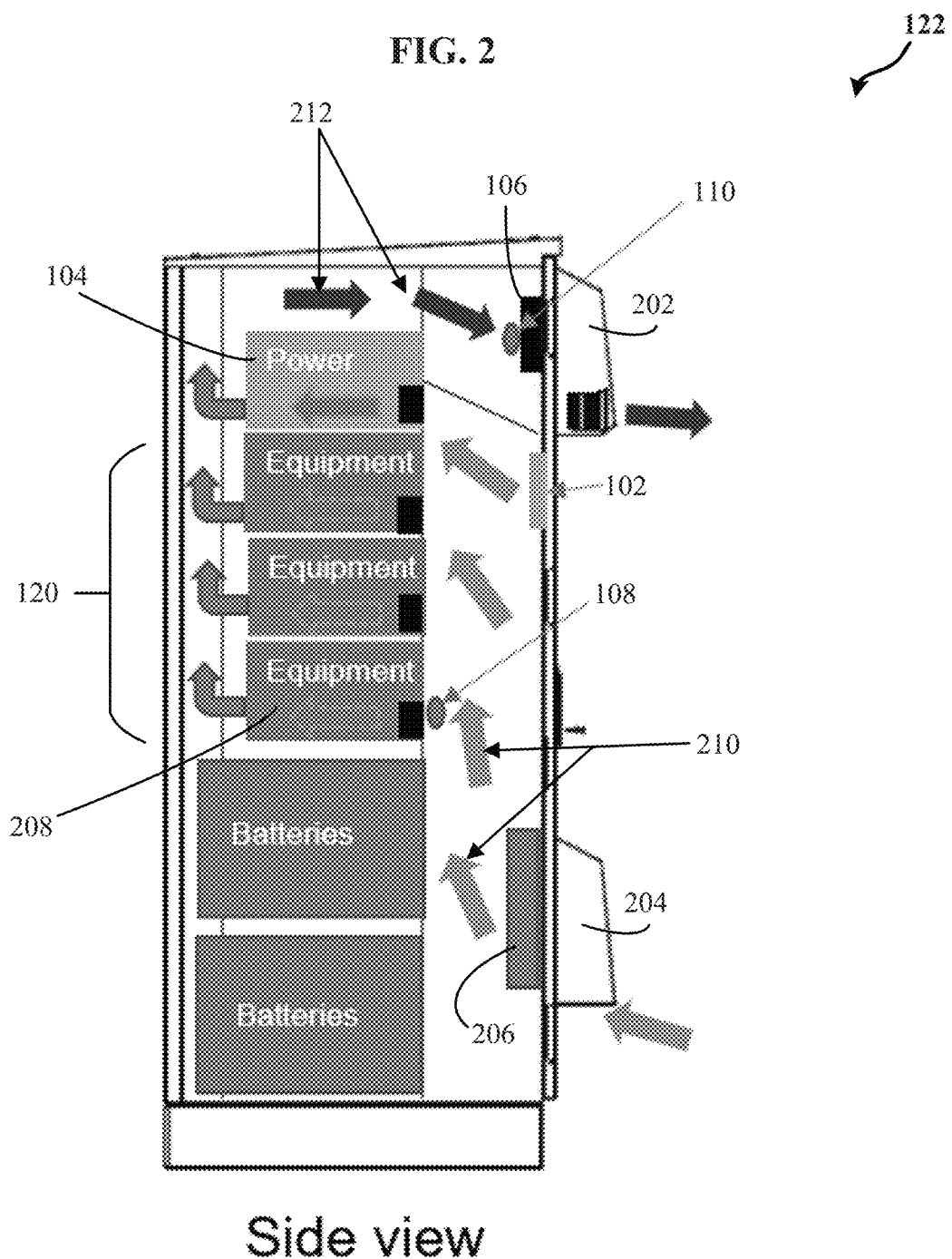
FIG. 2 is a simplified illustration of an exemplary enclosure in accordance with some embodiments.

FIGS. 1 and 2 are concurrently described below. FIG. 1 is a simplified block diagram of an exemplary system 100 for environmental control inside an enclosure 122 in accordance with some embodiments. FIG. 2 is a simplified illustration of an exemplary enclosure 122 in accordance with some embodiments. The system 100 includes an enclosure 122 housing one or more electronic equipment 120. In some embodiments, the enclosure 122 includes a standalone enclosure capable of being located inside a facility and/or out in the open. In some embodiments, the one or more electronic equipment 120 includes one or more radio equipment, communication transmission equipment, and/or power equipment. In some embodiments, the one or more electronic equipment 120 are associated with and/or configured to provide wired and/or wireless service to a private and/or public communication network. The enclosure 122 includes an inlet 204 and an outlet 202. In some embodiments, the inlet 204 is coupled to a fan filter unit 206 that filters out particles as the inlet air enters the enclosure 122. The system 100 further includes an exhaust fan 106 that may be located in proximity to the outlet 202 and draws air out of the enclosure 122 through the outlet 202. The system 100 may include a temperature sensor 110 located proximate the exhaust fan 106 and provides exhaust air temperature data (i.e., temperature of the exhaust air 212 expelled by the equipment housed in the enclosure 122. In some embodiments, the temperature sensor 110 is attached to the exhaust fan 106. In some embodiments, the temperature sensor 110, at least in part, provides a way for the FCU 102 to ensure that the operating temperature condition of the exhaust fan 106 is considered or not overridden during the FCU's 102 control and/or regulation of the environmental condition inside the enclosure 122.

The system 100 includes a first sensor 108 that may be located proximate the inlet 204 and/or a supply intake of at least one equipment of the enclosure 122. The first sensor 108 may provide sensor data associated with inlet air 210 that enters the enclosure 122. In some embodiments, the first sensor 108 includes a second temperature sensor, a humidity sensor, and/or an integrated temperature and humidity sensor. In some embodiments, the humidity sensor includes a relative humidity sensor. In some embodiments, the first sensor 108 is located proximate a first electronic equipment 208 of the one or more electronic equipment 120 or proximate and/or at a supply intake of the first electronic equipment 208. By one approach, the first electronic equipment 208 is closest to the inlet 204 relative to other electronic equipment of the one or more electronic equipment 120 as exemplified in FIG. 2. In some embodiments, the first sensor 108 is attached to the first electronic equipment 208. In some embodiments, the first sensor 108 may be placed at a location inside the enclosure 122 such that the sensed data is within a predetermined threshold of corresponding sensed data associated with the environment outside of the enclosure 122.

The system 100 includes a fan control unit (FCU) 102 coupled to the exhaust fan 106. The FCU 102 may adjust fan speed of the exhaust fan 106 based on fan speed control data provided by a power control unit (PCU) 104. The system 100 includes the PCU 104 coupled to the FCU 102, the temperature sensor 110, and/or the first sensor 108. In some embodiments, the FCU 102 may receive the sensor data from the first sensor 108, receive the exhaust air temperature data from the temperature sensor 110, and/or provide the fan speed control data to the FCU 102 based on the sensor data and the exhaust air temperature data to maintain one or more environmental parameters of the enclosure 122.

In some embodiments, the PCU 104 may provide power control data associated with supplying power to the one or more electronic equipment 120. Alternatively, or in addition, the PCU 104 may provide data and/or control for all aspects of power chain, such as AC main, DC power plant, battery backup, diesel generator, and/or the local site environment. In some embodiments, the PCU 104 may receive data from a remote computer/s 118 via a communication network 116. The remote computer/s 118 may include a server, a desktop computer, a laptop, a tablet, and/or any electronic equipment capable of facilitating control, monitor, update, maintain, and/or operate the PCU 104. For example, an update to one or more fan algorithms 114 stored in a storage memory 112 (e.g., read only memory, random access memory, hard drive, solid state drive, cloud storage unit, and/or the like) and used by the PCU 104 to determine the fan speed control data to maintain the one or more environmental parameters of the enclosure 122 may be downloaded from the PCU 104 via the communication network 116. In some embodiments, the update to the one or more fan algorithms 114 may be uploaded by a user of the remote computer/s 118. The communication network 116 may include a local area network (LAN), a wide area network (WAN), a point-to-point communication, Internet, and/or any wired and/or wireless communication network. In some embodiments, the PCU 104 and the FCU 102 are integrated into a main control unit.

In some embodiments, the PCU 104 sets a fan algorithm 114 corresponding to a selected environmental control mode of a plurality of environmental control modes of the enclosure 122. In some embodiments, the FCU 102 executes the fan algorithm 114. The plurality of operational environmental control modes may include a first mode and a second mode. In some embodiments, the first mode is selected when the enclosure 122 is configured to operate based on environmental parameters, such as an outdoor temperature and indoor (or inside-enclosure) temperature of an enclosure 122, that are defined by a user and/or based on a known industry standard (e.g., ETSI). In some embodiments, the second mode is selected when the enclosure 122 is configured to operate based on environmental parameters, such as indoor (or inside-enclosure) temperature of an enclosure 122 and/or a relative and/or an absolute humidity of the enclosure 122, as defined and/or determined by a user. The selected environmental control mode is used at least in part of the PCU 104 to determine a temperature at which the exhaust fan 106 starts, which is also referred to as a fan start temperature. In some embodiments, the fan start temperature may be determined by the user using a Mollier Diagram and/or determined automatically by the PCU 104 based at least on the use of a database representation of the Mollier Diagram along with the environmental parameters associated with the selected environmental control mode.

Figure 3:
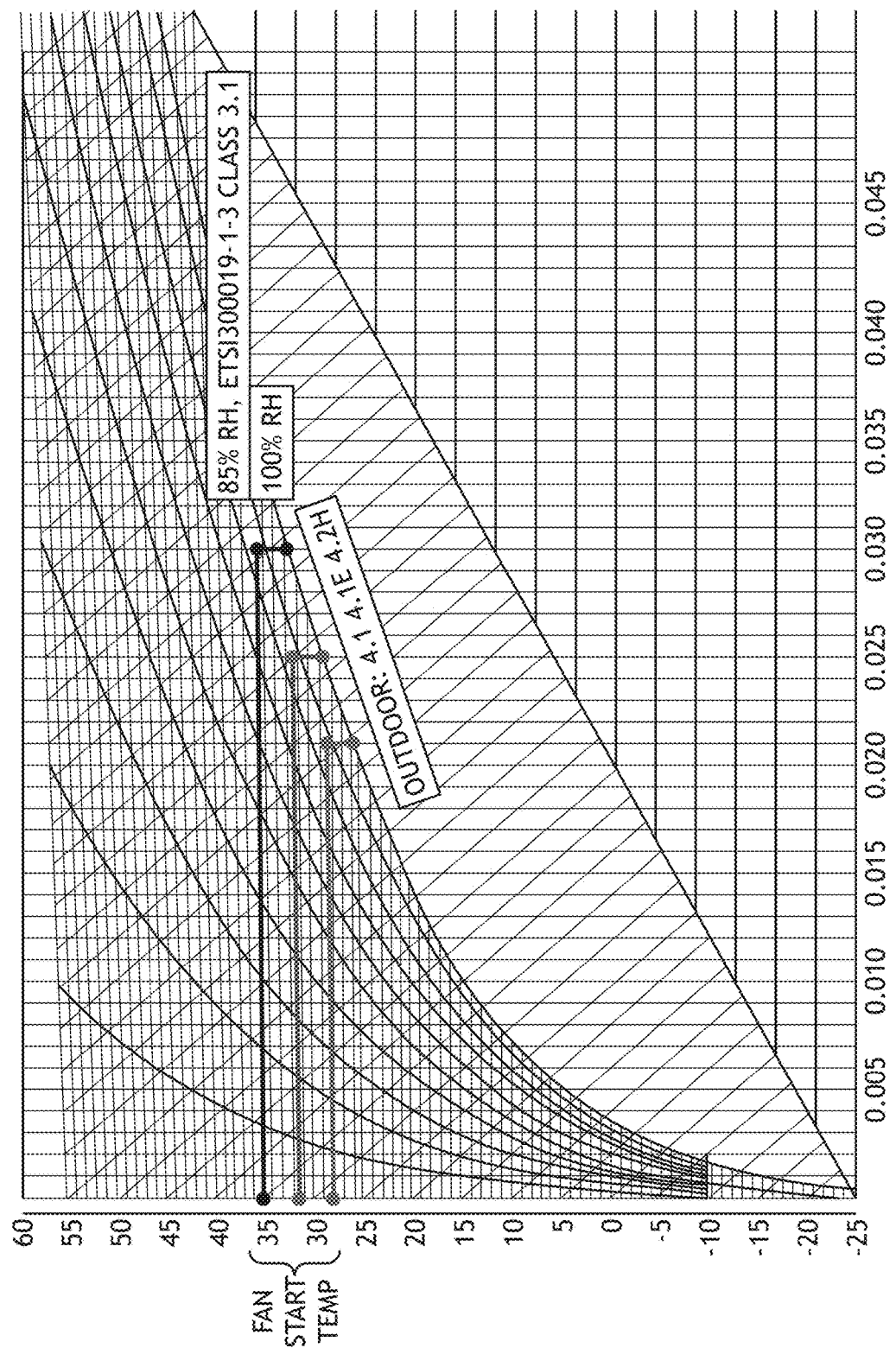
FIG. 3 illustrates a plurality of exemplary fan start temperatures based on environmental parameters associated with a first mode in accordance with some embodiments.

FIG. 3 illustrates a plurality of exemplary fan start temperatures based on environmental parameters associated with a first mode in accordance with some embodiments. In an illustrative non-limiting example, the outdoor environmental parameter and the indoor (or inside-enclosure) environmental parameter are defined in accordance with a Telecom Standard Environment Class. For example, the outdoor environmental parameter may be defined by the European Telecommunications Standard Institute (ETSI) 300 019-1-4 standard (class 4.1, 4.1E, or 4.2H). The internal environmental parameter may be defined by ETSI 300 019-1-3 standard (class 3.1). For example, for an outdoor environmental parameter based on ETSI class 4.1E, the high absolute humidity is 0.025 kg/kg and the high relative humidity (RH) is 100%. For internal environmental parameter based on ETSI class 3.1, the RH is 85%. Thus, to satisfy these two environmental parameters, the fan start temperature of the exhaust fan 106 may start at 32 degrees Celsius in accordance with the Mollier Diagram shown in FIG. 3. In the present disclosure, the fan start temperature corresponds to the lowest temperature of the inlet air 210 measured by the first sensor 108 that satisfies the environmental parameters associated with the selected environmental control mode.

Figure 4:
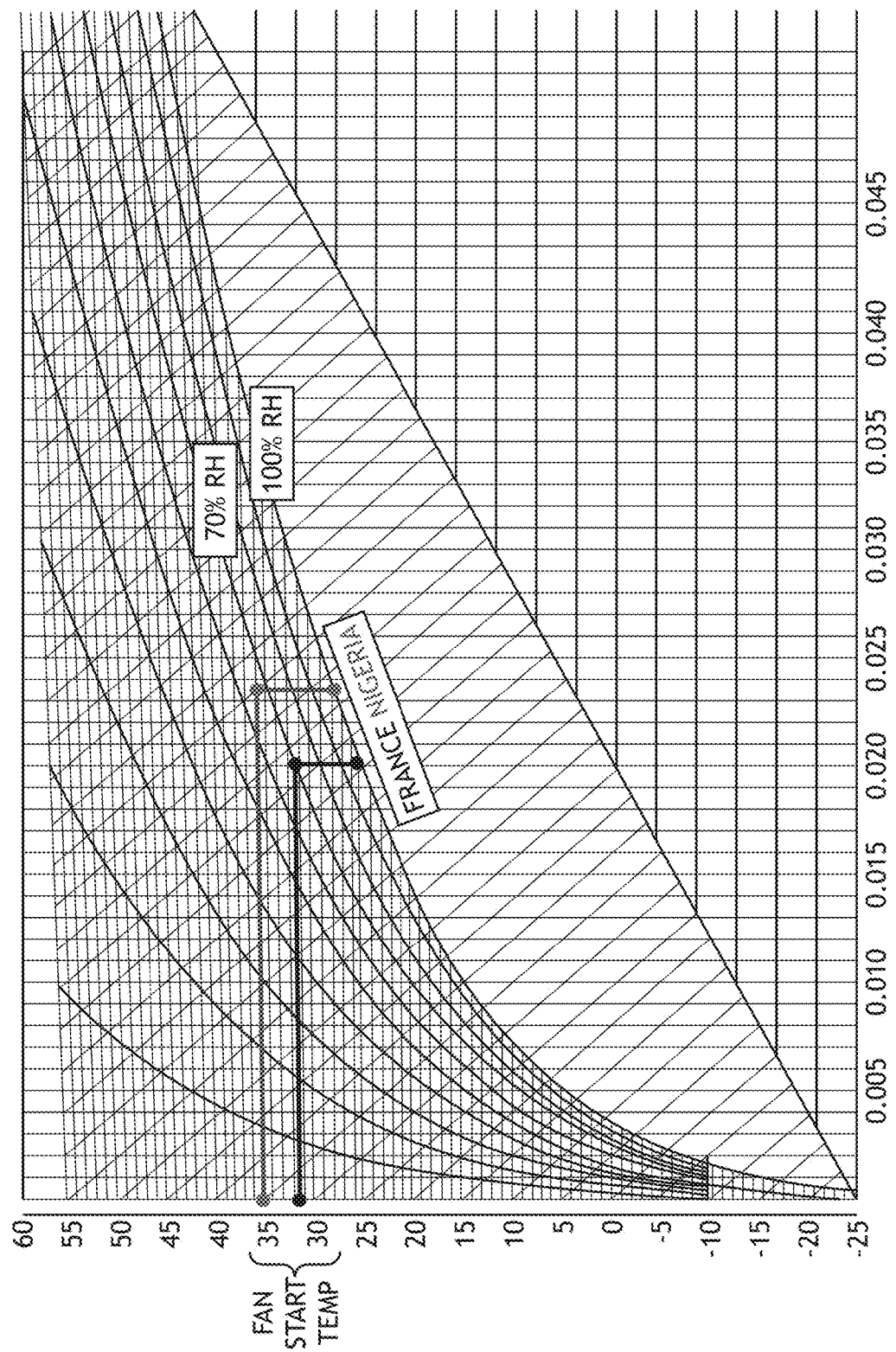
FIG. 4 illustrates a plurality of exemplary fan start temperatures based on environmental parameters associated with a first mode in accordance with some embodiments.

FIG. 4 illustrates a plurality of exemplary fan start temperatures based on environmental parameters associated with a first mode in accordance with some embodiments. In an illustrative non-limiting example, the outdoor environmental parameter and the indoor (or inside-enclosure) environmental parameter may be defined in accordance with the deployment location of the enclosure 122. In some embodiments, the outdoor environmental parameter and the indoor (or inside-enclosure) environmental parameter may be defined and/or predetermined by a user. For example, the user may input and/or select the RH parameter associated with the outdoor environment and the RH parameter associated with the internal environment of the enclosure 122. As illustrated in FIG. 4, an enclosure 122 that is located and/or used in France may be configured to operate in an outdoor environment having a relative humidity of 100% and an indoor (or inside-enclosure) environment having a relative humidity of 70%. Thus, to satisfy these two environmental parameters, the fan start temperature of the exhaust fan 106 may start at 31 degrees Celsius.

Figure 5:
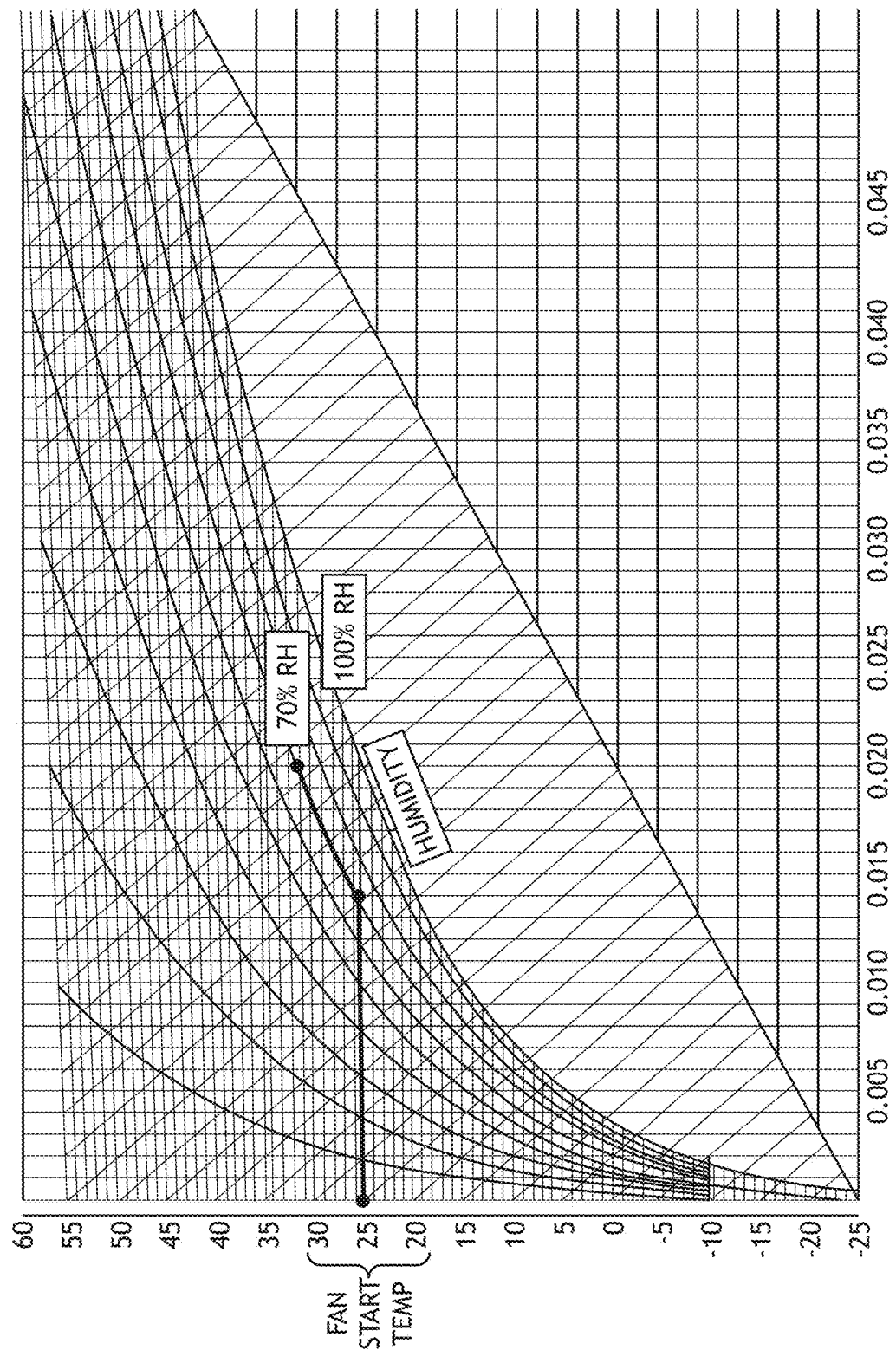
FIG. 5 illustrates a plurality of exemplary fan start temperatures based on environmental parameters associated with a second mode in accordance with some embodiments.

FIG. 5 illustrates a plurality of exemplary fan start temperatures based on environmental parameters associated with a second mode in accordance with some embodiments. In some approaches, the outdoor environmental parameter is not defined in the second mode, while the indoor (or inside-enclosure) environmental parameters are defined in the second mode. The indoor (or inside-enclosure) environmental parameters may include temperature and/or relative humidity levels inside the enclosure 122. In some embodiments, the temperature and the relative humidity in the second mode may be defined and/or predetermined by a user. In an illustrative non-limiting example shown in FIG. 5, the relative humidity is selected by a user to be 70% and the fan start temperature selected to be 25 degrees Celsius. As illustrated by the Mollier Diagram, at a particular fixed absolute humidity, if the temperature inside the enclosure increases, the relative humidity read by the first sensor 108 may decrease, as shown in FIG. 5. As a result, to maintain the relative humidity of 70%, the temperature inside the enclosure 122 is increased to lower the relative humidity read by the first sensor 108. In some embodiments, the temperature inside the enclosure 122 is increased by decreasing the fan speed of the exhaust fan 106.

Figure 6:
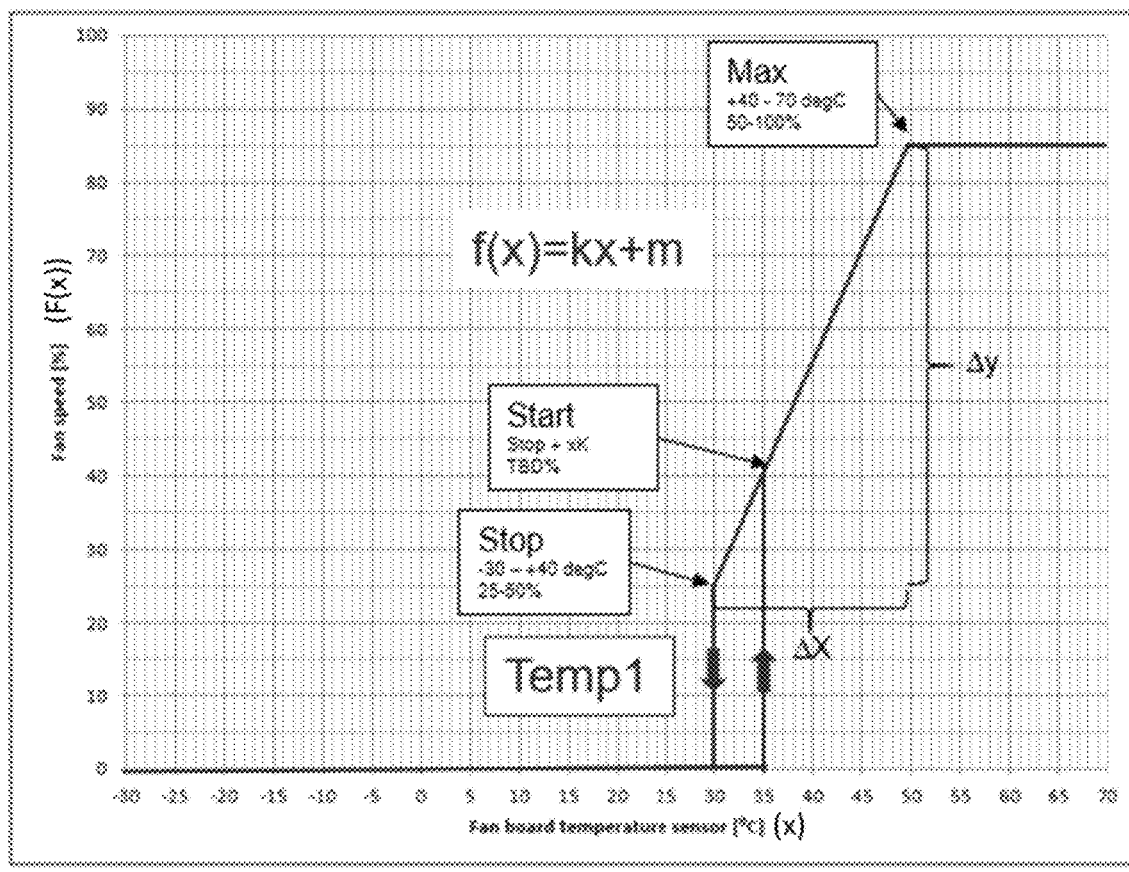
FIG. 6 shows an exemplary fan curve based on a temperature sensor sensing inlet air temperature of an enclosure in accordance with some embodiments.

Using the determined fan start temperature, the PCU 104 may determine the initial or starting speed of the exhaust fan 106. In some embodiments, using the received sensor data from the first sensor 108, the PCU 104 may adjust (by increasing or decreasing) the speed of the exhaust fan 106 using an exemplary fan algorithm illustrated in FIG. 6. FIG. 6 shows exemplary fan curves based on a temperature sensor sensing inlet air temperature of an enclosure 122 in accordance with some embodiments. In some embodiments, the stop temperature is selected by the user based on the defined lowest temperature of the equipment 120 or a battery temperature limitation. For example, the start and stop settings may provide a hysteresis for the fan in order for the fan to not start and stop constantly during certain conditions. The max settings for the fans can be selected depending on the operating temperature condition of the selected fan. For example, the operating temperature condition for the fans may depend on the operational temperature limits defined in the fan data sheet. In an illustrative non-limiting example, the determined fan start temperature is 35 degrees Celsius and the corresponding starting fan speed is 40% of the maximum fan speed. As illustrated, as the inlet air temperature increases, the PCU 104 provides a corresponding fan speed control data to the FCU 102 in order for the FCU 102 to adjust the fan speed of the exhaust fan 106 accordingly.

Figure 7:
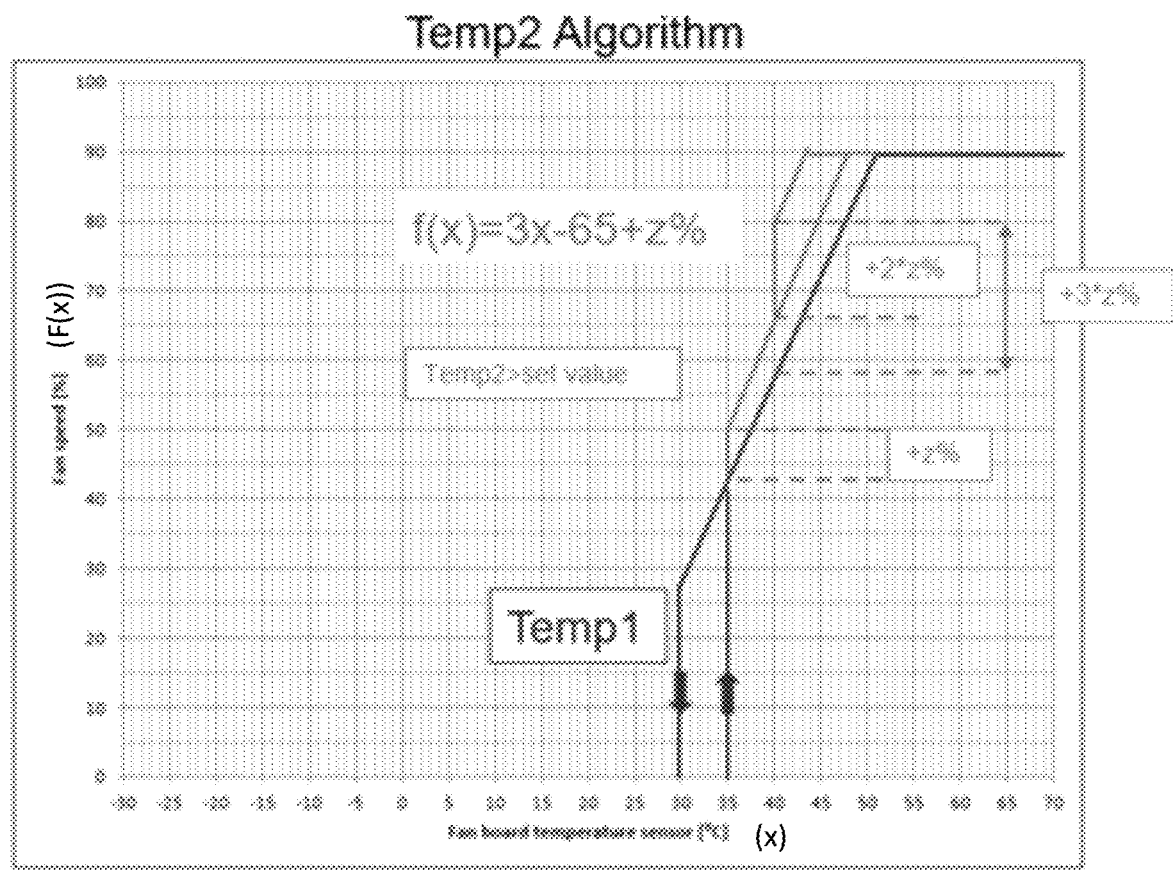
FIG. 7 shows exemplary fan curves based on a temperature sensor sensing inlet air temperature of an enclosure and a temperature sensor sensing exhaust air temperature.

FIG. 7 shows exemplary fan curves based on a temperature sensor (e.g., the first sensor 108) sensing inlet air temperature of an enclosure 122 and a temperature sensor (e.g., the temperature sensor 110) sensing exhaust air temperature. In an illustrative non-limiting example, when the exhaust air temperature read by the temperature sensor 110 has reached a first temperature threshold, the PCU 104 may increase the value of the fan speed determined by the fan algorithm illustrated in FIG. 6 by a predetermined incremental value and adjust the speed of the exhaust fan 106 based on the increased fan speed value in order to not jeopardize the fan due to the high temperature being outside its operating temperature range. In some embodiments, the predetermined incremental value may be further increased when the exhaust air temperature has reached a second temperature threshold. In some embodiments, the predetermined incremental value may include 5% and/or any value in a setting range of 1-20%. For example, the fan algorithms illustrated in FIGS. 7 and 8 may be chosen and/or selected by the PCU 104 and may be executed by the FCU 102. In such example, the first mode may correspond to FIG. 7 and the second mode may correspond to FIG. 8.

Figure 8:
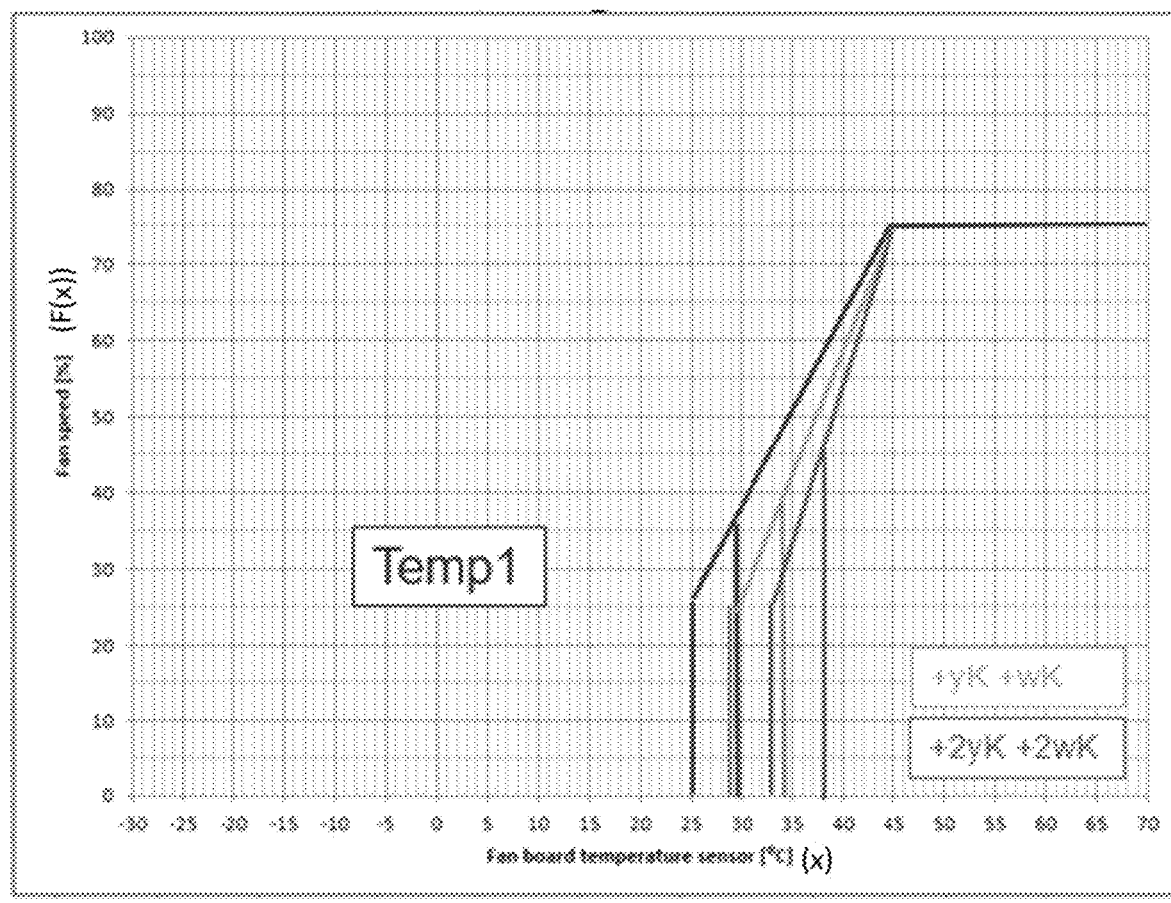
FIG. 8 shows exemplary fan curves based on one or more sensors sensing inlet air temperature and/or a relative humidity (RH) of an enclosure.

In some embodiments, when the selected environmental control mode is the second mode, the PCU 104 executes the fan algorithm illustrated in FIG. 8. FIG. 8 shows exemplary fan curves based on one or more sensors sensing inlet air temperature and relative humidity (RH) (e.g., the first sensor 108) of an enclosure 122. In an illustrative non-limiting example, when the RH read by the first sensor 108 (e.g., a humidity sensor or an integrated temperature and humidity sensor) has reached a humidity threshold, the speed of the exhaust fan 106 is decreased to increase the temperature and subsequently decrease the RH inside the enclosure 122. The stop/start temperatures are changed due to the humidity threshold. The settings of these stop/start values y and w can be selected but the default value is 5 Kelvin [K] degrees. In some embodiments, the start and/or start value may be any value in a setting range of 1-10K.

Figure 9:
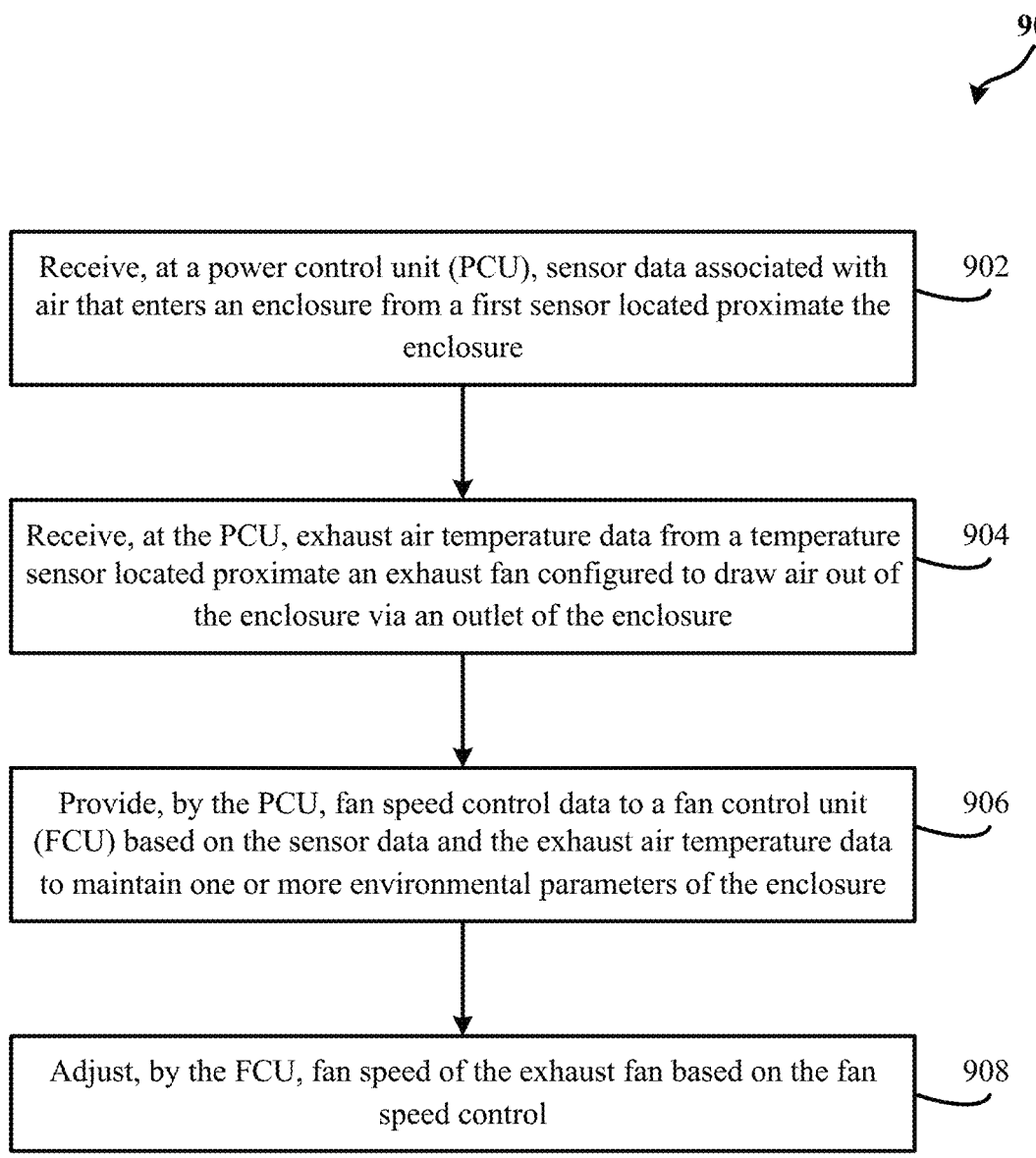
FIG. 9 shows a flow diagram of an exemplary method for environmental control inside an enclosure in accordance with some embodiments.

FIG. 9 shows a flow diagram of an exemplary method 900 for environmental control inside an enclosure 122 in accordance with some embodiments. In some embodiments, the method 900 may be implemented in the system 100 of FIG. 1 and/or a system 1000 of FIG. 10. In some embodiments, the method 900 for environmental control inside an enclosure 122 may include receiving, at a power control unit (PCU) 104, sensor data associated with air that enters the enclosure 122 from a first sensor 108 located proximate the supply intake of the first equipment 208 and/or any one or more of the equipment 120 of the enclosure 122, at step 902. The method 900 may include receiving, at the PCU 104, exhaust air temperature data from a temperature sensor 110 located proximate an exhaust fan 106 configured to draw air out of the enclosure 122 via an outlet 202 of the enclosure 122, at step 904. The method 900 may include providing, by the PCU 104, fan speed control data to a fan control unit (FCU) 102 based on the sensor data and the exhaust air temperature data to maintain one or more environmental parameters of the enclosure 122, at step 906. The method 900 may include adjusting, by the PCU 104 via FCU 102, fan speed of the exhaust fan 106 based on the fan speed control data, at step 908.

In some embodiments, one or more steps and/or functions described herein as being performed by the PCU 104 may be performed by the FCU 102. In some embodiments, one or more steps and/or functions described herein as being performed by the FCU 102 may be performed by the PCU 104.

Figure 10:
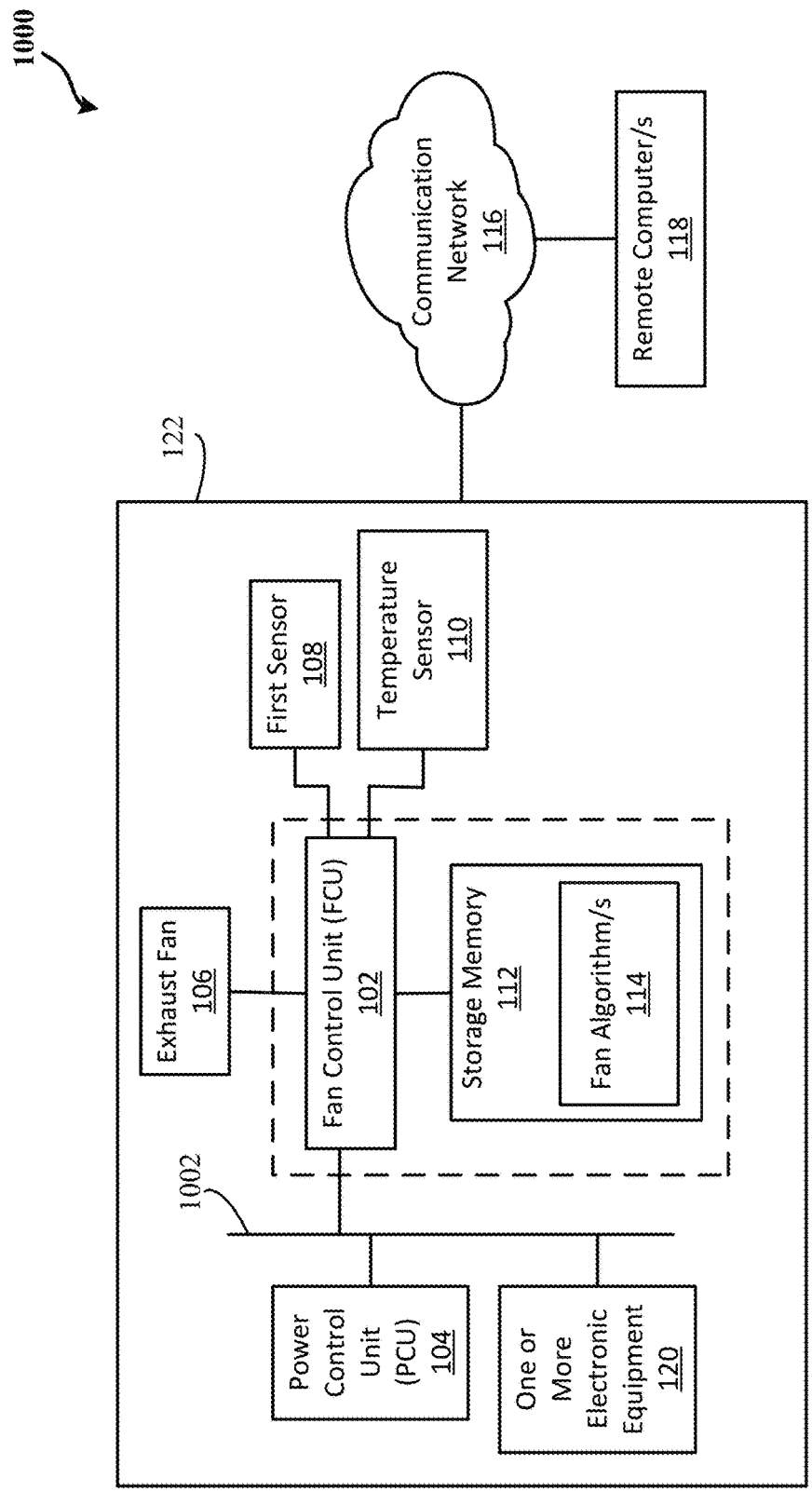
FIG. 10 is a simplified block diagram of an exemplary system for environmental control inside an enclosure in accordance with some embodiments.

FIG. 10 is a simplified block diagram of an exemplary system 1000 for environmental control inside an enclosure 122 in accordance with some embodiments. The system 1000 includes a first sensor 108 coupled to a fan control unit (FCU) 102. The first sensor 108 may provide sensor data associated with air that is supplied to at least one of one or more electronic equipment inside the enclosure 122. The system 1000 includes a temperature sensor 110 coupled to the FCU 102. The temperature sensor 110 may provide exhaust air temperature data to the FCU 102. In some embodiments, the system 1000 includes a power control unit (PCU) 104. The PCU 104 may be coupled to the FCU 102 via a communication bus 1002. In some embodiments, one or more electronic equipment 120 may couple to the PCU 104 and/or the FCU 102 via the communication bus 1002. In some embodiments, the system 1000 may correspond to the system 100. In some embodiments, one or more elements described and/or functions of the elements described in the system 100 may correspond to one or more elements and/or functions of the elements described in the system 1000 and/or shown in FIG. 10.

Figure 11:
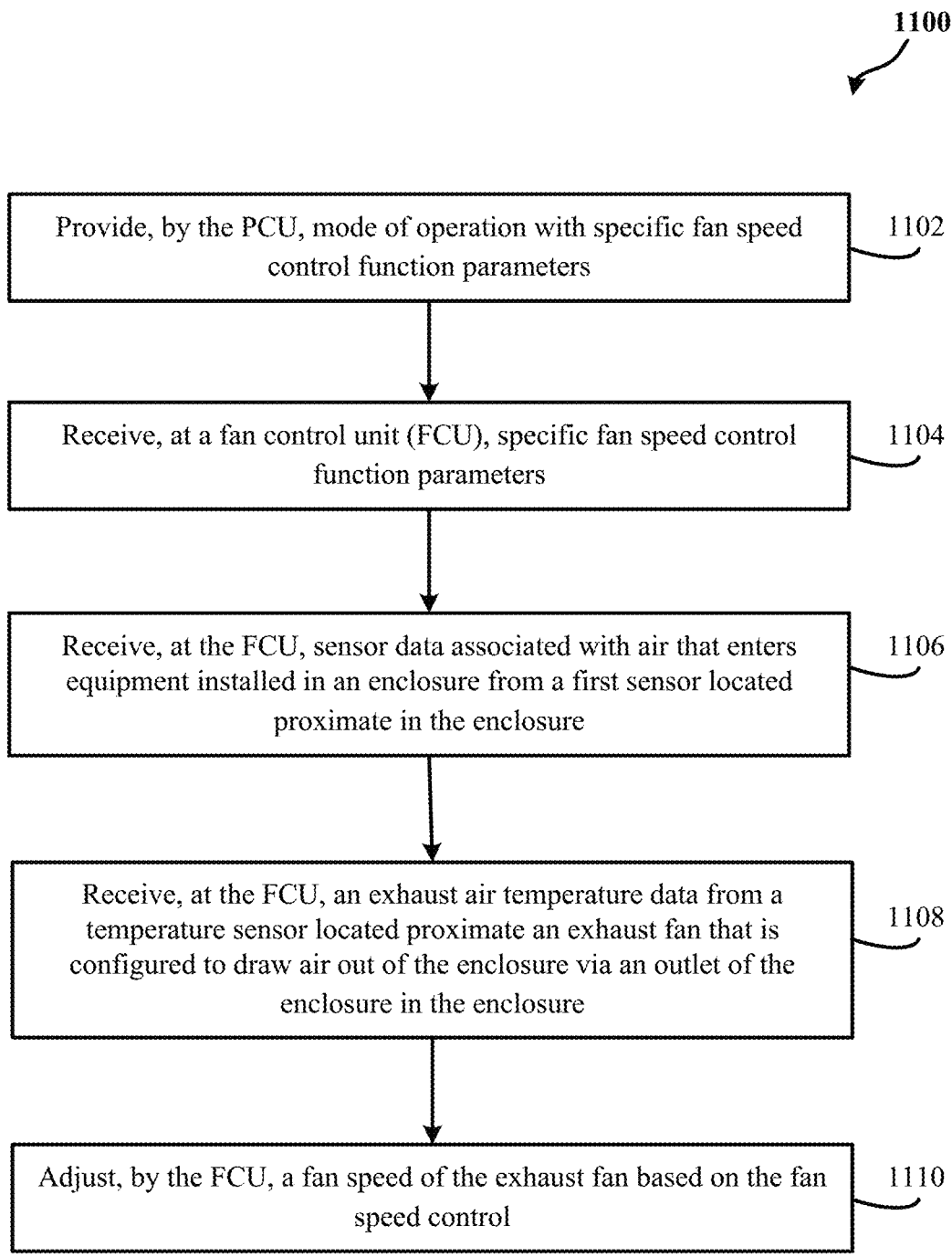
FIG. 11 shows a flow diagram of an exemplary method for environmental control inside an enclosure in accordance with some embodiments.

FIG. 11 shows a flow diagram of an exemplary method 1100 for environmental control inside an enclosure 122 in accordance with some embodiments. In some embodiments, the method 1100 may be implemented in the system 100 of FIG. 1 and/or the system 1000 of FIG. 10. The method 1100 for environmental control inside an enclosure 122 may include providing, by a power control unit (PCU), a mode of operation with specific fan speed control function parameters, at step 1102. The method 1100 may include receiving, at a fan control unit (FCU), specific fan speed control function parameters, at step 1104. The method 1100 may include receiving, at the FCU, sensor data associated with air that enters equipment installed in an enclosure from a first sensor located proximate in the enclosure, at step 1106. The method 1100 may include receiving, at the FCU, an exhaust air temperature data from a temperature sensor located proximate an exhaust fan that is configured to draw air out of the enclosure via an outlet of the enclosure in the enclosure, at step 1108. The method 1100 may include adjusting, by the FCU, a fan speed of the exhaust fan based on the fan speed control, at step 1110.

A system for environmental control inside an equipment enclosure comprising: an enclosure configured to house one or more electronic equipment, the enclosure comprising an inlet and an outlet; an exhaust fan located in proximity to the outlet or within the enclosure and configured to create an airflow out of the enclosure through the outlet; a temperature sensor located proximate the exhaust fan and configured to provide exhaust air temperature data; a first sensor located proximate a supply intake of one of the one or more electronic equipment and configured to provide sensor data associated with air that is supplied to the one of the one or more electronic equipment inside the enclosure; a fan control unit (FCU) coupled to the exhaust fan, the FCU configured to adjust fan speed of the exhaust fan based on fan speed control data; and a power control unit (PCU) coupled to the FCU, the temperature sensor, and the first sensor, the PCU configured to: receive the sensor data from the first sensor; receive the exhaust air temperature data from the temperature sensor; and provide the fan speed control data to the FCU based on the sensor data and the exhaust air temperature data to maintain one or more environmental parameters of the enclosure.

The system of any preceding clause wherein the PCU is further configured to provide power control data associated with supplying power to the one or more electronic equipment.

The system of any preceding clause wherein the PCU is further configured to receive data from a remote computer via a communication network.

The system of any preceding clause wherein the first sensor is located proximate a first electronic equipment of the one or more electronic equipment, and wherein the first electronic equipment is closest to the inlet relative to other electronic equipment of the one or more electronic equipment.

The system of any preceding clause wherein the first sensor is attached to the first electronic equipment.

The system of any preceding clause wherein the one or more electronic equipment comprises radio equipment, communication transmission equipment, and power equipment.

The system of any preceding clause wherein the temperature sensor is attached to the exhaust fan.

The system of any preceding clause wherein the first sensor comprises a second temperature sensor, a humidity sensor, and an integrated temperature and humidity sensor.

The system of any preceding clause wherein the PCU is further configured to: execute a fan algorithm corresponding to a selected environmental control mode of a plurality of operational environmental control modes of the enclosure, wherein the plurality of operational environmental control modes comprise a first mode and a second mode, wherein the first mode defines an outdoor environmental parameter and an internal environmental parameter of the one or more environmental parameters of the enclosure, and wherein the second mode defines the internal environmental parameter and a humidity parameter of the one or more environmental parameters of the enclosure; and determine the fan speed control data based on a result of the execution of the fan algorithm.

The system of any preceding clause wherein at least one of the outdoor environmental parameter and the internal environmental parameter is based on a Mollier Diagram.

A method for environmental control inside an enclosure comprising: receiving, at a power control unit (PCU), sensor data associated with air that enters the enclosure from a first sensor located proximate a supply intake of at least one electronic equipment inside the enclosure; receiving, at the PCU, exhaust air temperature data from a temperature sensor located proximate an exhaust fan configured to create an airflow out of the enclosure via an outlet of the enclosure; providing, by the PCU, fan speed control data to a fan control unit (FCU) based on the sensor data and the exhaust air temperature data to maintain one or more environmental parameters of the enclosure; and adjusting, by the FCU, fan speed of the exhaust fan based on the fan speed control data.

The method of any preceding clause further comprising providing, by the PCU, power control data associated with supplying power to the at least one electronic equipment.

The method of any preceding clause further comprising receiving, by the PCU, data from a remote computer via a communication network.

The method of any preceding clause wherein the first sensor is located proximate the at least one electronic equipment, and wherein the at least one electronic equipment is closest to an inlet of the enclosure.

The method of any preceding clause wherein the first sensor is attached to the at least one electronic equipment.

The method of any preceding clause wherein the at least one electronic equipment comprises radio equipment, communication transmission equipment, and power equipment.

The method of any preceding clause wherein the temperature sensor is attached to the exhaust fan.

The method of any preceding clause wherein the first sensor comprises a second temperature sensor, a humidity sensor, and an integrated temperature and humidity sensor.

The method of any preceding clause further comprising: executing, by the PCU, a fan algorithm corresponding to a selected environmental control mode of a plurality of operational environmental control modes of the enclosure, wherein the plurality of operational environmental control modes comprise a first mode and a second mode, wherein the first mode defines an outdoor environmental parameter and an internal environmental parameter of the one or more environmental parameters of the enclosure, and wherein the second mode defines the internal environmental parameter and a humidity parameter of the one or more environmental parameters of the enclosure; and determining, by the PCU, the fan speed control data based on a result of the executing of the fan algorithm.

The method of any preceding clause wherein at least one of the outdoor environmental parameter and the internal environmental parameter is based on a Mollier Diagram.

Those skilled in the art will recognize that a wide variety of other modifications, alterations, and combinations can also be made with respect to the above described embodiments without departing from the scope of the invention, and that such modifications, alterations, and combinations are to be viewed as being within the ambit of the inventive concept.

What is claimed is:

1. A system for environmental control inside an equipment enclosure comprising:
    an enclosure configured to house one or more electronic equipment, the enclosure comprising an inlet and an outlet;
    an exhaust fan located in proximity to the outlet or within the enclosure and configured to create an airflow out of the enclosure through the outlet;
    a temperature sensor located proximate the exhaust fan and configured to provide exhaust air temperature data;
    a first sensor located proximate a supply intake of one of the one or more electronic equipment and configured to provide sensor data associated with air that is supplied to the one of the one or more electronic equipment inside the enclosure;
    a fan control unit (FCU) coupled to the exhaust fan, the FCU configured to adjust fan speed of the exhaust fan based on fan speed control data; and
    a power control unit (PCU) coupled to the FCU, the temperature sensor, and the first sensor, the PCU configured to:
        receive the sensor data from the first sensor;
        receive the exhaust air temperature data from the temperature sensor; and
        execute a fan algorithm corresponding to a selected environmental control mode of a plurality of operational environmental control modes of the enclosure, wherein the plurality of operational environmental control modes comprise a first mode and a second mode, wherein the first mode defines an outdoor environmental parameter and an internal environmental parameter of the one or more environmental parameters of the enclosure, and wherein the second mode defines the internal environmental parameter and a humidity parameter of the one or more environmental parameters of the enclosure;
        determine the fan speed control data based on a result of the execution of the fan algorithm; and
        provide the fan speed control data to the FCU based on the sensor data and the exhaust air temperature data to maintain one or more environmental parameters of the enclosure.

2. The system of claim 1, wherein the PCU is further configured to provide power control data associated with supplying power to the one or more electronic equipment.

3. The system of claim 1, wherein the PCU is further configured to receive data from a remote computer via a communication network.

4. The system of claim 1, wherein the first sensor is located proximate a first electronic equipment of the one or more electronic equipment, and wherein the first electronic equipment is closest to the inlet relative to other electronic equipment of the one or more electronic equipment.

5. The system of claim 4, wherein the first sensor is attached to the first electronic equipment.

6. The system of claim 1, wherein the one or more electronic equipment comprises radio equipment, communication transmission equipment, and power equipment.

7. The system of claim 1, wherein the temperature sensor is attached to the exhaust fan.

8. The system of claim 1, wherein the first sensor comprises a second temperature sensor, a humidity sensor, and an integrated temperature and humidity sensor.

9. The system of claim 1, wherein at least one of the outdoor environmental parameter and the internal environmental parameter is based on a Mollier Diagram.

10. A method for environmental control inside an enclosure comprising:
receiving, at a power control unit (PCU), sensor data associated with air that enters the enclosure from a first sensor located proximate a supply intake of at least one electronic equipment inside the enclosure;
receiving, at the PCU, exhaust air temperature data from a temperature sensor located proximate an exhaust fan configured to create an airflow out of the enclosure via an outlet of the enclosure;
providing, by the PCU, fan speed control data to a fan control unit (FCU) based on the sensor data and the exhaust air temperature data to maintain one or more environmental parameters of the enclosure;
executing, by the PCU, a fan algorithm corresponding to a selected environmental control mode of a plurality of operational environmental control modes of the enclosure, wherein the plurality of operational environmental control modes comprise a first mode and a second mode, wherein the first mode defines an outdoor environmental parameter and an internal environmental parameter of the one or more environmental parameters of the enclosure, and wherein the second mode defines the internal environmental parameter and a humidity parameter of the one or more environmental parameters of the enclosure; and
determining, by the PCU, the fan speed control data based on a result of the executing of the fan algorithm; and
adjusting, by the FCU, fan speed of the exhaust fan based on the fan speed control data.

11. The method of claim 10, further comprising providing, by the PCU, power control data associated with supplying power to the at least one electronic equipment.

12. The method of claim 10, further comprising receiving, by the PCU, data from a remote computer via a communication network.

13. The method of claim 10, wherein the first sensor is located proximate the at least one electronic equipment, and wherein the at least one electronic equipment is closest to an inlet of the enclosure.

14. The method of claim 13, wherein the first sensor is attached to the at least one electronic equipment.

15. The method of claim 10, wherein the at least one electronic equipment comprises radio equipment, communication transmission equipment, and power equipment.

16. The method of claim 10, wherein the temperature sensor is attached to the exhaust fan.

17. The method of claim 10, wherein the first sensor comprises a second temperature sensor, a humidity sensor, and an integrated temperature and humidity sensor.

18. The method of claim 10, wherein at least one of the outdoor environmental parameter and the internal environmental parameter is based on a Mollier Diagram.

* * * * *